United States Patent
Ohkawa

[11] Patent Number: 5,993,678
[45] Date of Patent: Nov. 30, 1999

[54] DEVICE AND METHOD FOR PROCESSING A PLASMA TO ALTER THE SURFACE OF A SUBSTRATE

[75] Inventor: Tihiro Ohkawa, La Jolla, Calif.

[73] Assignee: Toyo Technologies Inc., La Jolla, Calif.

[21] Appl. No.: 08/690,149

[22] Filed: Jul. 31, 1996

[51] Int. Cl.$^6$ .................................................. H05H 1/00
[52] U.S. Cl. ........................ 216/68; 427/571; 156/345; 118/723 I
[58] Field of Search ................... 156/345; 118/723 E, 118/723 I; 427/571; 204/298.37; 216/68

[56] References Cited

U.S. PATENT DOCUMENTS

| | | |
|---|---|---|
| 4,780,682 | 10/1988 | Politzer . |
| 4,842,707 | 6/1989 | Kinoshita ............................ 156/345 X |
| 5,108,982 | 4/1992 | Woolf et al. . |
| 5,225,740 | 7/1993 | Ohkawa . |
| 5,304,279 | 4/1994 | Coultas et al. .......................... 156/345 |
| 5,350,454 | 9/1994 | Ohkawa . |
| 5,361,016 | 11/1994 | Ohkawa et al. . |
| 5,431,769 | 7/1995 | Kisakibaru et al. ..................... 156/345 |

*Primary Examiner*—Thi Dang
*Attorney, Agent, or Firm*—Nydegger & Associates

[57] ABSTRACT

A device, and a method for using the device, for altering the surface of a substrate with a plasma includes a vessel having a chamber, a magnet and a plasma generator. Both the generator and the magnet are positioned outside the vessel while the substrate to be altered is placed in the chamber. The magnetic field is established substantially parallel to the substrate surface that is to be altered to insulate the plasma from the substrate surface. Also, a radio frequency wave is propagated from the generator into the chamber to generate the plasma in chamber which alters the surface. Specifically, the plasma is generated in ionization zones located between the substrate surface and the vessel walls. A region in the chamber is thus defined between the ionization zones where the plasma is established with substantially uniform density. Additionally, electrodes can be placed to voltage bias directly or capacitively the plasma for ion etching or deposition on the substrate surface.

23 Claims, 1 Drawing Sheet

DEVICE AND METHOD FOR PROCESSING A PLASMA TO ALTER THE SURFACE OF A SUBSTRATE

FIELD OF THE INVENTION

The present invention pertains generally to devices and systems for altering the surface of a substrate by either etching or deposition. More particularly, the present invention pertains to systems and processes which use plasma for etching or deposition. The present invention is particularly, but not exclusively useful for the etching and deposition of a substrate surface in the manufacture of integrated circuits.

BACKGROUND OF THE INVENTION

As is well known, a plasma is an ionized gaseous discharge which includes free electrons, charged ions and neutral species which are sometimes referred to simply as neutrals. It is also well known that, depending on the particular constituents of the plasma, a plasma can be used either to etch a substrate surface or to deposit material onto the substrate surface. Present methods for plasma etching and plasma deposition, however, have some shortcomings.

Insofar as plasma etching and plasma deposition are concerned, certain physical characteristics of a plasma are of particular importance. Firstly, it is basic knowledge that the velocities of free electrons in a plasma, greatly exceed the velocities of charged ions. It is also known that particulates can form from negatively charged species in a plasma. Further, it is known that a magnetic field has a significant effect upon free electron transport in the plasma. Specifically, plasma flux in a direction perpendicular to the magnetic field is significantly inhibited. With the above in mind, certain phenomena should be considered.

If there is no control over the flux of the faster moving free electrons in a plasma, the free electrons will leave the plasma. Accordingly, the plasma will tend to become positively charged. This condition, in turn, promotes the formation and retention of negatively charged particulates in the plasma. These particulates, however, undesirably degrade the quality of the deposition or etching on the substrate surface. Another problem stems from the fact that if the plasma is not somehow insulated from the surface of the substrate, the substrate can become overheated and, thereby, possibly damaged. This becomes even more troublesome when high plasma densities are achieved.

In addition to merely generating a plasma, an efficient plasma etching or plasma deposition system needs to have a control over the functioning of the system. Stated differently, it is desirable if the system operator is able to control independently the flux of positive ions and neutrals toward the substrate surface to be altered. Further, it is obviously desirable if the surface is predictably altered. The implied consequence of this is that the plasma needs to have a uniform density over the substrate surface that is to be altered. Finally, it is desirable that the system be responsive and able to function in a short period of time.

In light of the above it is an object of the present invention to provide a system for processing a plasma to alter the surface of a substrate having a large surface area. Another object of the present invention is to provide a system for processing a plasma to alter the surface of a substrate which can etch the surface of a substrate, or deposit material onto the surface of a substrate, at a relatively high speed. Still another object of the present invention is to provide a system for processing a plasma to alter the surface of a substrate which can control the flux of ions or neutrals from the plasma toward the surface of the substrate. Another object of the present invention is to provide a system for processing a plasma to alter the surface of a substrate which produces a beam-like ion flux into the substrate so that deep trenches can be cut into the substrate. Yet another object of the present invention is to provide a system for processing a plasma to alter the surface of a substrate which inhibits the unwanted formation of particulates in the plasma. Another object of the present invention is to provide a system for processing a plasma to alter the surface of a substrate which allows for the generations of a plasma having a uniform density. Still another object of the present invention is to provide a system for processing a plasma to alter the surface of a substrate which shields the substrate from a high electric field. It is also an object of the present invention to provide a system for processing a plasma to alter the surface of a substrate which is relatively easy to manufacture, is easy to use and comparatively cost effective.

SUMMARY OF THE PREFERRED EMBODIMENTS

In accordance with the present invention, a system for altering the surface of a substrate includes a vessel for holding the substrate in a gaseous environment, an antenna for ionizing gas in the vessel to form a plasma, and a magnet for creating a magnetic field which insulates the substrate from the plasma. As intended for the present invention, the system can be used to alter the substrate surface either by the deposition of neutral material from the plasma onto the surface, or by etching the surface with ions and neutrals from the plasma.

The vessel which is to be used for the system of the present invention is preferably cylindrical in shape, and the cylinder is hollow to form a chamber for the vessel. The walls of this chamber are preferably made with an insulating material, such as glass. In an alternate embodiment for the vessel, the walls of the vessel can be made with a stronger material, such as a metal. For this alternate embodiment, however, the metal walls are preferably lined with an insulator. For the present invention this insulative liner can either cover the entire wall area or only partially cover the wall area.

The antenna for the system of the present invention is located externally to the vessel, and is positioned to direct RF energy into the chamber. Specifically, RF energy from the antenna, which is preferably in the form of a so-called Electron Magneto-Sonic Wave, is directed toward predetermined ionization zones in the chamber. The plasma in the chamber is thus generated in these ionization zones.

The magnet, like the antenna, is located externally to the vessel. Importantly, the flux lines of the magnetic field generated by the magnet are aligned in the chamber so they will be substantially parallel to the surface of the substrate. For purposes of the present invention, either a permanent magnet or an electrical magnet can be used. Further, the magnetic field in the chamber can be rotated to enhance uniformity of the field. This, rotation, however, can be done only so long as the flux lines remain substantially parallel to the surface of the substrate.

To set up the system of the present invention, the substrate is axially centered in the chamber of the vessel. Also, as indicated above, the substrate is placed in the chamber so that the substrate surface to be altered is substantially parallel to the flux lines of the magnetic field. The antenna is then adjusted to direct RF energy into ionization zones which are located between the surface of the substrate and the walls of the chamber.

In the operation of the system of the present invention, once the substrate has been properly placed in the chamber, and after the chamber has been filled with the appropriate gases, the antenna is activated to ionize the portion of the gas that is in the predetermined ionization zones. As is well known, this ionization results in a plasma which contains free electrons, ions, and un-ionized molecules or atoms (i.e. neutrals). In the absence of a magnetic field, the faster traveling free electrons will eventually leave the plasma and cause it to become positively charged with respect to the substrate. For the present invention, however, due to the insulated chamber walls and the orientation of the magnetic field in the chamber, several different consequences result for the plasma.

The first consequence is, the plasma which is created in the vessel is magnetically insulated from the surface of the substrate. This happens because, in the order of their influence on charged particles, magnetic fields have a greater affect on free electrons, while they have much less effect on ions, and no effect on neutrals. Accordingly, for the system of the present invention, the travel of free electrons in a direction perpendicular to the magnetic field (i.e. toward the substrate surface) is inhibited more so than is the travel of the slower moving positively charged ions. Consequently, free electrons tend to remain with the plasma and, in turn, to attract the positively charged ions. Thus, these ions also tend to remain with the plasma because the walls are electrically insulated. One result of this is that the plasma flux to the substrate is greatly reduced without affecting the flux of neutral species.

Secondly, because the magnetic field causes a much slower rate of electron transport to the substrate compared to the ion transport, the plasma charges up negative with respect to the substrate. Thus, the plasma does not retain and promote the growth of negatively charged particulates which can easily contaminate the surface of the substrate.

As indicated above, plasma in the vessel is generated in predetermined ionization zones. Further, as also indicated above, these ionization zones are located between the walls of the vessel and the surface of the substrate. In addition, the ionization zones are located diametrically opposite from each other in the chamber. Consequently, there is a region between the ionization zones that is directly above the surface of the substrate. In fact, the entire surface of the substrate is positioned under this region. Importantly, due to the fact that the plasma flows readily along the magnetic field, whereas the plasma transport across the magnetic field is very slow, there is a uniform density for the plasma in the region.

For operations of the system where the deposition of material onto a substrate surface is desired, a plasma is created in the region above the substrate surface as indicated above. Due to the fact the magnetic field has negligible effect on the neutrals in the plasma, these neutrals will not be effectively inhibited in their travel toward the substrate surface. Thus, and because there is a uniform density for plasma in the region, the neutrals can be uniformly deposited over the surface of the substrate. Because the plasma flux to the substrate is reduced by the magnetic field, the heat load and damage by the impinging ions to the substrate are also reduced. Thus, a high deposition rate can be achieved without undue heating of the substrate.

For operations of the system where it is desired to etch the surface of the substrate, the plasma is created in a manner that is similar to that used for deposition. Additionally, for etching, the substrate is periodically charged to attract ions from the plasma to the surface of the substrate. These ions and the neutrals then etch the surface in a manner well known in the art. Preferably, for the purposes of the present invention, the substrate is capacitively charged. In an alternate embodiment, however, an electrode can be placed in the vessel wall for contact with the plasma. The electrode can then be electrically connected to the substrate. This, in turn, will cause the now negatively charged substrate to attract the positively charged etching ions from the plasma. Because of the magnetic insulation, the mobility of the electrons is greatly reduced and this allows a high voltage to be applied for extraction and acceleration of the ions. Beam-like ion streams thus produced are suitable for narrow trench etching.

BRIEF DESCRIPTION OF THE DRAWINGS

The novel features of this invention, as well as the invention itself, both as to its structure and its operation, will be best understood from the accompanying drawing, taken in conjunction with the accompanying description, in which similar reference characters refer to similar parts, and in which:

The FIGURE is a cross sectional schematic representation of the component subassemblies of the system of the present invention.

DESCRIPTION OF THE PREFERRED EMBODIMENT

Figure 1:
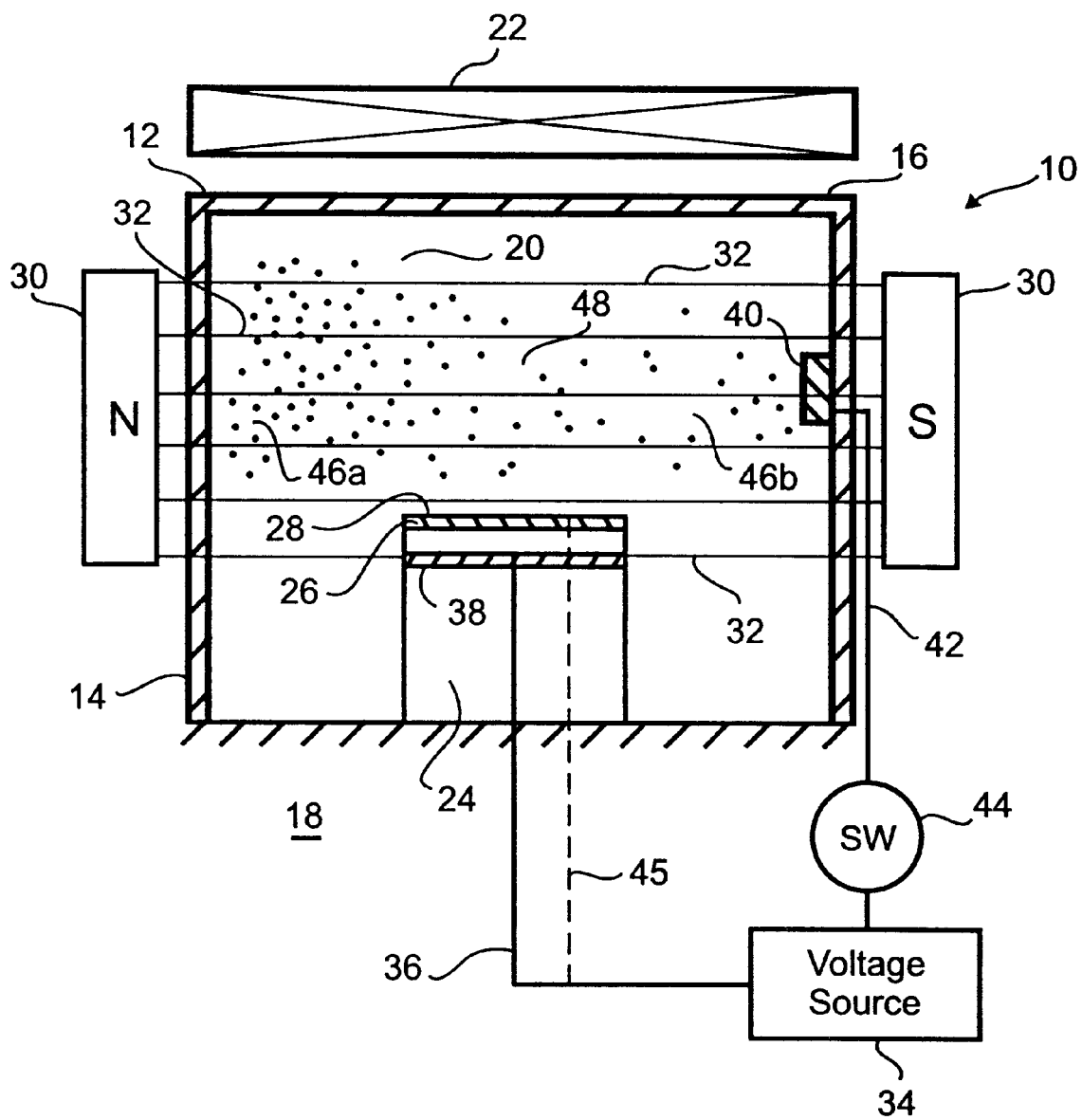

Referring to the FIGURE, a system for processing a plasma to alter the surface of a substrate is shown and generally designated 10. As seen in the FIGURE, system 10 includes a vessel 12 which has walls 14 and a top 16. Preferably, the vessel 12 is generally cylindrical in shape and is made of an insulating material, such as glass. For purposes of the present invention, the vessel 12 is placed on a base 18 to form a chamber 20 between the walls 14 and top 16 of vessel 12, and the base 18. It is to be understood that materials other than glass may be used for the manufacture of vessel 12. If so, the walls 14 of vessel 12 should be lined with a dielectric material so that the chamber 20 is insulated.

System 10 also includes an antenna 22. As shown in the FIGURE, antenna 22 is mounted externally to the vessel 12 and is positioned generally across the top 16 of vessel 12. From this position, antenna 22 propagates radio frequency (r-f) power into the chamber 20. The antenna 22 can be of any type well known in the pertinent art. Preferably, however, antenna 22 is a spiral antenna which has the ability to control the propagation pattern of r-f power that is transmitted by antenna 22. As will become apparent from subsequent disclosure, it is important that this propagation pattern be tailored to direct r-f power into predetermined ionization zones within the chamber 20.

The FIGURE also shows that system 10 includes a pedestal 24. Specifically, the pedestal 24 is mounted on base 18 and is surrounded by the vessel 12. This configuration places the pedestal 24 so that it projects somewhat into the chamber 20. A substrate 26 is placed on pedestal 24 to expose a surface 28 of the substrate 26 to the chamber 20. As intended for the present invention, the substrate 26 can be made of any material having a surface 28 which the operator of system 10 desires to alter by plasma etching or plasma deposition.

A magnet 30 is positioned externally to the vessel 12 substantially as shown in the FIGURE. Importantly, the magnetic field of the magnet 30, as shown and represented by the lines 32, are oriented substantially parallel to the surface 28 of substrate 26. As envisioned by the present invention, the magnet 30 can be of any type well known in the art, such as a permanent magnet or an electro-magnetic device. Regardless what type magnet is used, as stated above, it is important that the magnetic field 32 be oriented substantially parallel to the surface 28 which is to be altered. Also, it may be advantageous to rotate the magnetic field 32 about an axis which is symmetrically central to the vessel 12 and generally perpendicular to the surface 28. If so, and again as stated above, it is important that the magnetic field 32 remain oriented substantially parallel to the surface 28 and, therefore, perpendicular to the central axis of the vessel 12. For purposes of the present invention, the magnetic field 32 can be rotated by any means now known in the pertinent art.

If desired, a voltage source 34 can be provided which, via a connector 36, is electrically connected to a charge plate 38. As shown, the charge plate 38 is mounted on pedestal 24 and is capacitively connected to the substrate 26. In a manner well known to the skilled artisan, the voltage source 34 can be activated to selectively change the potential of the substrate 26. In another arrangement, which can be established for the same purpose of changing the potential of substrate 26, an electrode 40 can be mounted in chamber 20 on the wall 14 of vessel 12. In this arrangement, the electrode 40 is connected via connector 42 and switch 44 to voltage source 34. Operation of switch 44 can then complete the connection of voltage source 34 directly to the substrate 26 via a line 45.

OPERATION

In the operation of the system 10 of the present invention, a substrate 26 is placed on pedestal 24 with the surface 28 exposed. The pedestal 24 and substrate 26 are then positioned inside the chamber 20 of vessel 12. At this time, the chamber 20 is sealed. Next, the gaseous material that is to be ionized into a plasma is introduced into the chamber 20. Although the particular gas to be used with the system 10 of the present invention is generally a matter of choice, it is known that carbon tetrafluoride gas is well suited for etching operations, while Silane is suitable for a deposition operation.

Once the substrate 26 has been positioned in chamber 20, all adjustments are made on magnet 30 that are needed to orient its magnetic field 32 substantially parallel to the surface 28 of substrate 26. For purposes of the present invention, modest field strengths in the range of from fifty to one thousand gauss (50–1,000 gauss) can be used. Next, the antenna 22 is activated to direct r-f power into the chamber 20. It happens for the present invention that a rather wide range of frequencies can be used. Preferably, the frequency of the r-f power from antenna 22 is in the range of from 1 MHz to 1 GHz.

For the purposes of the present invention, antenna 22 is a generator which is configured to direct its r-f power primarily into ionization zones 46 which are located in the chamber 20. Specifically, these ionization zones 46 are located between the substrate 26 and the walls 14 of vessel 12. Preferably, this r-f power is in the form of an Electron Magneto-Sonic (EMS) Wave. This preference for an EMS Wave is due to the fact that the magnetic insulation established by the system 10 prevents inducement of an azimuthal as is normally generated by similar antennas used for Transformer Coupled Plasma (TCP). Thus, it is important to use an r-f heating method for system 10 which is compatible with the magnetic insulation. Because it can propagate across a magnetic field, an EMS Wave is suitable for this purpose. Consequently, the design for antenna 22 and the particular r-f frequency to be used must be chosen in a way to generate an EMS Wave.

The ionization zones 46a and 46b shown in the FIGURE are representative of the zones 46. Above the surface 28 of substrate 26, and between the ionization zones 46a and 46b in the chamber 20 is a region 48. The importance of this region 48 in the operation of system 10 comes into play as the plasma is generated in the chamber 20.

As implied above, as r-f power is propagated into the chamber 20, plasma is generated in the ionization zones 46. Because the walls 14 of vessel 12 are made of an insulating material (e.g. glass), and due to the orientation of the magnetic field 32 in chamber 20 (i.e. parallel to surface 28), the plasma which is generated will generally be confined to the zones 46 and to the region 48 between the zones 46. This happens for several interrelated reasons. Firstly, the insulating properties of the walls force the electron and the ion flux to the wall to be equal by keeping free electrons in the plasma from leaving the plasma by conduction through wall 14. Secondly, magnetic field 32 inhibits plasma transport in a direction perpendicular to the magnetic field 32. Thus, the flux of free electrons toward substrate 28 is greatly reduced. Thirdly, because the magnetic field 32 has relatively little, if any, effect on plasma transport in a direction parallel to the magnetic field 32, plasma density is freely and uniformly increased in the region 48. As a consequence of all this, the plasma remains negatively charged relative to the substrate 26. Also, and very importantly, the magnetic field 32 effectively insulates substrate 26 from the heat that is generated in the plasma and, accordingly, substrate 26 does not suffer unacceptable heat damage.

For a deposition operation, a plasma is generated in region 48 and the neutrals which result from the generation of this plasma are allowed to deposit onto the surface 28 of substrate 26. As will be appreciated by those skilled in the art, masks can be used to cover surface 28 so that deposition occurs on only selected portions of the surface 28. Further, due to the increased plasma densities and the uniformity of the plasma density in the region 48 that are possible with system 10, the deposition onto surface 28 can be done quickly and with a sufficient yield.

For etching operations, it is necessary that positively charged ions be attracted to the surface 28 of substrate 26. Consequently, it is desirable to establish a negative potential for the substrate 26 relative to the plasma. With this potential, the positively charged ions from the plasma will be attracted to the surface 28 for etching the surface. The establishment of a negative potential for the substrate 26 can be accomplished in several ways.

Again referring to the FIGURE, it will be seen that the voltage source 34 can be selectively activated to place a negative charge on the charge plate 38 and capacitively on substrate 28. This, then, will attract positively charged ions toward the surface 28 in an ion beam. It happens that this ion beam is very useful for creating trench etching in the surface 28. In an alternate embodiment, the free electron in the plasma can be collected by the electrode 40. Then in accordance with activation of the switch 44 the substrate 28, which is directly connected to the voltage source 34 can be negatively charged to attract ions in the plasma toward the surface 28 for etching.

For capacitive coupling between the charge plate 38 and substrate 26 it is well known that a net electric charge can not be transmitted capacitively. The time average must vanish. With this in mind, the charge plate 38 is pulsed negatively to accelerate the plasma ions towards the substrate 26. Between these negative pulses, a small positive voltage is put on to the charge plate for a duration of time which is much longer than the duration of the negative pulses. The plasma electrons slowly reach the substrate across the magnetic insulation during the period when the charge plate is slightly positive. In other words, the substrate receive bursts of the ions followed by slow arrival of the electrons. The time integrated net electric charge is nil.

While the particular system/device for processing a plasma to alter the surface of a substrate as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

I claim:

1. A method for processing plasma to alter the surface of a substrate, the plasma including free electrons, positively charged ions and neutrals, the method which comprises the steps of:

positioning a substrate having a surface on a pedestal in an insulated chamber of a vessel, said vessel having a substantially cylindrical wall defining an axis, and said surface of said substrate being positioned in said chamber at a distance from said wall and oriented substantially perpendicular to said axis to define a region in said chamber above said surface along said axis and separated from said wall by said distance;

propagating radio frequency energy from an antenna into predetermined ionization zones in said chamber for creating said plasma in said ionization zones to alter said surface of said substrate, said predetermined ionization zones being located substantially outside said region and between said region and said wall, and extending through said distance between said surface and said wall with said ionization zones being between said surface and said wall of said vessel for flow of said plasma from said ionization zones into said region between said ionization zones to establish a substantially uniform density for said plasma in said region above said surface; and establishing a magnetic field in said chamber, said magnetic field being applied substantially perpendicular to said axis to insulate said plasma from said substrate.

2. A method as recited in claim 1 further comprising the step of rotating said magnetic field about said axis.

3. A method as recited in claim 1 further comprising the step of applying a negative charge to said substrate to accelerate the positively charged ions in said plasma toward said surface to alter said surface of said substrate.

4. A method as recited in claim 1 wherein said propagating step is accomplished by directed the radio frequency energy into ionization zones, said ionization zones being located between said substrate and said vessel.

5. A method as recited in claim 4 wherein said propagating step is accomplished using radio frequency power in the form of an Electron Magneto-Sonic Wave directed toward said predetermined ionization zones.

6. A device for processing a plasma to alter the surface of a substrate which comprises:

a vessel having a substantially cylindrical wall;

a pedestal mounted in said vessel for supporting said substrate to position said surface at a substantial distance from said wall;

a magnet for establishing a magnetic field, said magnetic field being oriented with flux lines substantially parallel to said surface;

an insulator on said wall for insulating a region of said magnetic field, said region being located adjacent and above said surface and separated from said wall by said distance; and an antenna for directing radio frequency power to generate a plasma for altering said surface, said plasma being generated by said radio frequency power in predetermined ionization zones for flow of said plasma from said ionization zones into said region above said surface and between said ionization zones to establish a substantially uniform density for said plasma in said region, said ionization zones being located outside said region and between said region and said wall, and extending through said distance between said surface and said wall, said ionization zones being further located between said surface and said insulator and said region being located above said surface between said ionization zones.

7. A system as recited in claim 1 wherein said plasma includes neutrals, and said neutrals contact said surface to etch said surface.

8. A system as recited in claim 1 wherein said plasma includes neutrals, and said neutrals contact said surface for deposition of said neutrals onto said surface.

9. A system as recited in claim 1 wherein the plasma includes positively charged ions, and the system further comprises a charge plate for negatively charging the substrate relative to the plasma to attract the positively charged ions from the plasma to the substrate to etch the surface.

10. A system as recited in claim 1 further comprising means for rotating the magnetic field.

11. A system as recited in claim 1 wherein said magnet for establishing a magnetic field is a permanent magnet.

12. A system as recited in claim 1 wherein said insulator for insulating a region is a vessel formed with a chamber for holding the plasma and the substrate therein.

13. A system as recited in claim 1 wherein said generator for creating a plasma is an antenna for transmitting radio frequency energy into said ionization zones to generate said plasma.

14. A system as recited in claim 1 wherein said insulator is located between said substrate and said magnet for establishing a magnetic field.

15. A system as recited in claim 1 wherein said insulator is located between said substrate and said generator for creating a plasma.

16. A device as recited in claim 1 wherein said generator uses radio frequency power in the form of an Electron Magneto-Sonic Wave directed toward said predetermined ionization zones to generate said plasma.

17. A device for processing a plasma to alter the surface of a substrate which comprises:

a pedestal for supporting said substrate;

a vessel having a substantially cylindrical wall defining an axis and formed with a chamber for insulating said plasma therein, said substrate being positioned on said pedestal in said chamber with said surface of said substrate positioned at a substantial distance from said wall and oriented substantially perpendicular to said axis to define a region in said chamber above said surface along said axis and separated from said wall by said distance;

a magnet positioned outside said vessel for establishing a magnetic field in said chamber, said magnetic field being applied substantially perpendicular to said axis; and an antenna positioned outside said vessel for propagating a radio frequency energy into predetermined ionization zones for creating said plasma in said ionization zones to alter said surface of said substrate, said predetermined ionization zones being located substantially outside said region and between said region and said wall, and extending through said distance between said surface and said wall of said vessel for flow of said plasma from said ionization zones into said region between said ionization zones to establish a substantially uniform density for said plasma in said region above said surface.

18. A device as recited in claim 17 wherein said vessel is made of glass.

19. A device as recited in claim 17 further comprising an electrode means positioned outside said vessel for accelerating ions in said plasma toward said surface of said substrate to alter said surface.

20. A device as recited in claim 17 further comprising means for rotating said magnetic field about said axis.

21. A device as recited in claim 17 wherein said magnetic field has a field strength in a range of from about one hundred to one thousand Gauss (100–1,000 Gauss).

22. A device as recited in claim 17 wherein said magnetic means is a laminated transformer coil having at least three poles.

23. A device as recited in claim 17 wherein said radio frequency energy has a frequency in a range of from about one megahertz to about one gigahertz (1 MHz–1 GHz).

* * * * *

UNITED STATES PATENT AND TRADEMARK OFFICE
CERTIFICATE OF CORRECTION

PATENT NO. : 5,993,678
DATED : November 30, 1999
INVENTOR(S) : Tihiro Ohkawa

Page 1 of 3

It is certified that error appears in the above-identified patent and that said Letters Patent is hereby corrected as shown below:

Column 8, Line 21
DELETE
[claim 1]
INSERT
--claim 6--

Column 8, Line 24
DELETE
[claim 1]
INSERT
--claim 6--

Column 8, Line 27
DELETE
[claim 1]
INSERT
--claim 6--

Column 8, Line 32
DELETE
[claim 1]
INSERT
--claim 6--

UNITED STATES PATENT AND TRADEMARK OFFICE
CERTIFICATE OF CORRECTION

PATENT NO. : 5,993,678
DATED : November 30, 1999
INVENTOR(S) : Tihiro Ohkawa

It is certified that error appears in the above-identified patent and that said Letters Patent is hereby corrected as shown below:

Column 8, Line 34
DELETE
[claim 1]
INSERT
--claim 6--

Column 8, Line 36
DELETE
[claim 1]
INSERT
--claim 6--

Column 8, Line 38
DELETE
[claim 1]
INSERT
--claim 6--

Column 8, Line 42
DELETE
[claim 1]
INSERT
--claim 6--

UNITED STATES PATENT AND TRADEMARK OFFICE
CERTIFICATE OF CORRECTION

PATENT NO. : 5,993,678
DATED : November 30, 1999
INVENTOR(S) : Tihiro Ohkawa

It is certified that error appears in the above-identified patent and that said Letters Patent is hereby corrected as shown below:

Column 8, Line 45
DELETE
[claim 1]
INSERT
--claim 6--

Column 8, Line 48
DELETE
[claim 1]
INSERT
--claim 6--

Signed and Sealed this

Twenty-second Day of August, 2000

Attest:

Q. TODD DICKINSON

Attesting Officer

Director of Patents and Trademarks